United States Patent [19]

McCoy

[11] 4,181,980

[45] Jan. 1, 1980

[54] ACQUISITION AND STORAGE OF ANALOG SIGNALS

[75] Inventor: Michael R. McCoy, Santa Clara, Calif.

[73] Assignee: Electronic Arrays, Inc., Mountain View, Calif.

[21] Appl. No.: 905,991

[22] Filed: May 15, 1978

[51] Int. Cl.$^2$ .................. G11C 27/00; G11C 11/40
[52] U.S. Cl. .................................. 365/45; 365/185
[58] Field of Search .................. 365/184, 185, 45; 320/1; 307/238

[56] References Cited

U.S. PATENT DOCUMENTS 4,054,864  10/1977  Audaire et al. .................. 365/45

Primary Examiner—Stuart N. Hecker
Attorney, Agent, or Firm—Smyth, Pavitt, Siegemund, Jones & Martella

[57] ABSTRACT

An MOS device with a floating gate and a conductively connected gate is operated in that pulses are applied to the latter gate to capacitively charge the floating gate, and the drain potential is compared in-between pulses with the analog signal. Pulse application is stopped when agreement has been reached.

6 Claims, 1 Drawing Figure

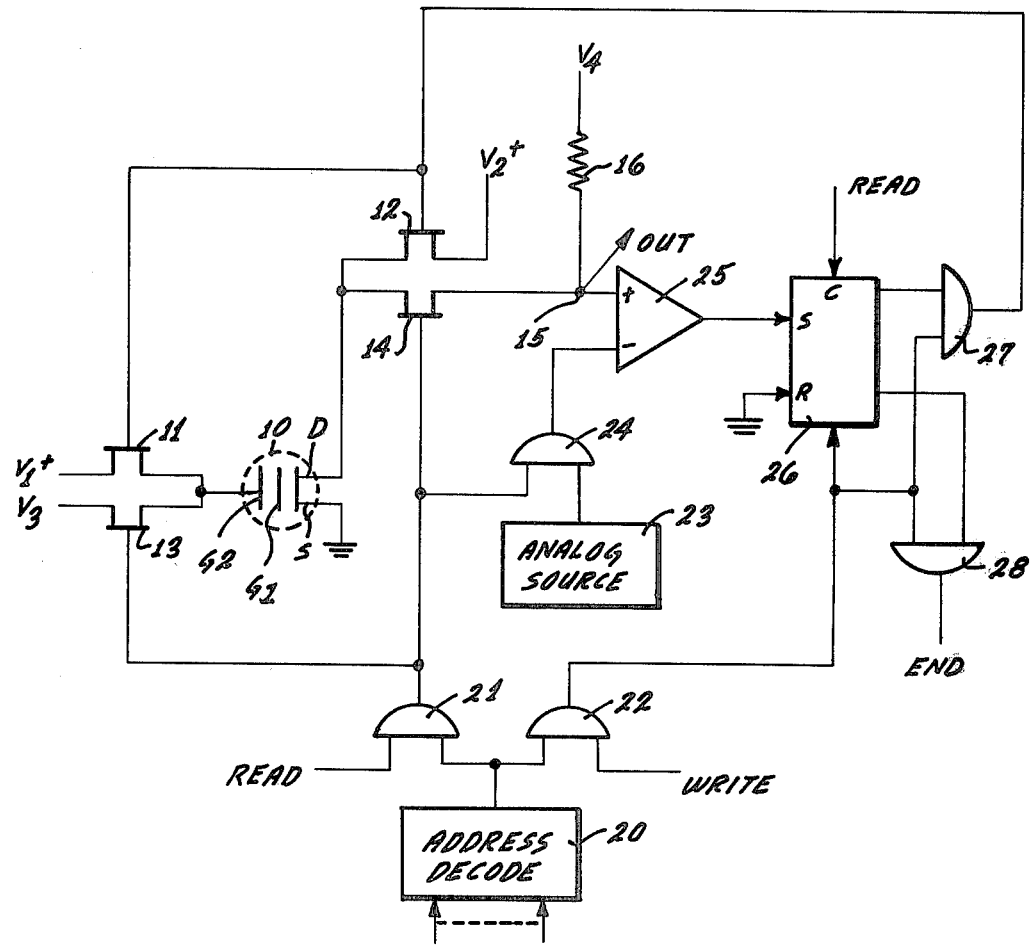

ACQUISITION AND STORAGE OF ANALOG SIGNALS

BACKGROUND OF THE INVENTION

The present invention relates to a new and improved method and apparatus for the acquisition and storage of analog signals.

In recent years so-called nonvolatile semiconductor memory devices have been developed. These devices are constructed in a variety of ways, notably here the so-called charge trapping devices operating with a structure which can be described as metal silicon-nitride silicon-dioxide silicon, whereby the latter two layers establish the channel between source and drain electrodes in the silicon. Another type of device is called a floating gate device having basically a silicon silicon-dioxide silicon struction but an additional silicon gate is embedded in the silicon-dioxide and in complete isolation from the outer silicon electrode (conventional gate), and from the source-to-drain path in the silicon substrate. It should be noted, however, that charge-trapping and floating gate are used frequently synonymously.

I refer to a summary treatment of the various devices in a paper by J. J. Chang, "Nonvolatile Semiconductor Memory Devices, Proceedings of the IEEE, Vo. 64, No. 7, July 1976." Either of these devices can also be called a nonvolatile charge storage device. The process of charging the floating gate involves either avalanche breakdown above the insulation between the channel and the floating gate; a typical device is, for example, disclosed in U.S. Pat. No. 3,797,000. Another way of charging the floating gate is through tunnelling requiring a rather thin insulation between gate and channel; a typical device is, for example, disclosed in U.S. Pat. No. 3,500,142. It is believed that neither of the known devices has been used in conjunction with analog signal processing other than processing digitized signals, nor is a suggestion along that line derivable from these references.

DESCRIPTION OF THE INVENTION

It is an object of the present invention to provide a new and improved storage of analog signals.

In accordance with the preferred embodiment of the present invention, it is suggested to use a nonvolatile charge storage device for storing a charge therein being in direct proportion to the value of an analog signal. The device is presumed to have a conduction channel in a semiconductor substrate along a boundary with an insulating layer; the channel defines or is defined by a source-to-drain path. The insulating (e.g., oxide) layer is further presumed to have embedded a non-insulating layer which is completely isolated by the insulating layer and is capable of receiving charge carriers either through tunneling or through avalanche diode breakdown, as effective across the insulation.

In the preferred form of practicing the invention, the charge is augmented preferably on a pulsating basis, and the effect the charge increase has on the conduction of the device under particular biasing conditions is compared with the analog signal or a representation thereof; the charging process is terminated when the conduction through the channel is a measure or particular representation of the analog signal.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

The FIGURE is a circuit diagram, supplemented by block diagram representation illustrating the preferred embodiment of the present invention.

Proceeding now to the detailed description of the drawings the Figure illustrates an MOS device 10 of the insulated, floating gate variety having a P-conductive silicon substrate and N+ source and drain zones respectively for a source electrode S, a drain electrode D. Therefore, the device operates with an N-channel. In addition, device 10 includes a first gate G, being completely embedded in insulating material (e.g., Si $O_2$). The gate $G_1$ is preferably made of metal or polychrystaline silicon, and is embedded alongside the source-to-drain channel but well insulated therefrom. The thickness of the insulation between gate $G_1$, and the substrate depends on the mode of operation for charging the floating gate. Since the substrate is P-conductive, tunneling is preferred as it involves electrons rather than holes. A second, control or terminal gate $G_2$ is disposed above floating gate $G_1$ and also well insulated therefrom.

The system or device 10 exhibits, basically, two capacitances, one between the gate electrodes $G_1$ and $G_2$, and one between the floating gate G, and the source-to-drain path. Depending upon the electrostatic charge state of gate $G_1$, the source-to-drain path is biased by that floating gate to a particular state of conduction, reflecting the charge content of the floating gate G. The nature of the device ensures long term retention of that charge.

The device 10 can be operated in the write mode or in the read mode. In write mode, a transistor 11 being, e.g., of the regular MOS-FET variety, couples a rather high voltage $V_1$ of about +20 volts to gate $G_2$, while concurrently the drain electrode of device 10 is biased to a voltage $V_2$, also being about +20 volts, via a second MOS-FET 12. The source electrode of the device is permanently grounded (or connectable to any suitable reference voltage). Biasing of the channel in that fashion ensures the availability of electrons having energy levels to permit tunneling.

In view of the fact that the device 10 is an N channel device, positive voltages on gate $G_2$ and drain D cause electrons to tunnel through the insulation between the channel and the gate $G_1$ onto that floating gate. The amount of electrons reaching the gate $G_1$, and the charge accumulation on that gate is comparatively little dependent upon the magnitude of the charge voltage, but depends primarily on the duration of the charge as so applied. A significant portion of the channel is near-ground potential, so that indeed an electrical field is set up from control electrode $G_2$ to the channel permitting the electrons to be driven onto the gate $G_1$ located in the path of that field.

The capacitive coupling between gates $G_1$ and $G_2$ is made to be considerably greater than the coupling between $G_1$ and the channel, so that comparatively very few electrons are drawn off gate $G_1$ onto gate $G_2$. Following a charge and upon turning transistors 11 and 12 off electrons which tunneled to gate $G_1$ are trapped and the floating gate $G_1$ is negatively charged relative to the source-to-drain channel, applying, therefore, a negative bias to the channel, raising the threshold of conduction.

For reasons below, the two transistors 11 and 12 receive control pulses of rather short duration so that each applies the requisite charge voltages for the transfer of charges of definite coulomb quantity for the floating gate $G_1$. Charges so applied are cumulative, so that a series of pulses raises the voltage of gate $G_1$ with reference to the drain-to-source path of device 10.

The value of the charge on the floating gate $G_1$ can be read from the device by applying a rather low but still positive voltage of about 5 volts to the gate $G_2$, via a transistor 13. The same signal that gates open transistor 13 is also applied to a transistor 14 which couples the drain electrode of device 10 to a terminal 15. A resistor 16 is also connected to the terminal 15 to apply thereto a voltage $V_4$ of about 5 volts. The source-to-drain path of device 10 and the resistor 16 act in voltage divider configuration, whereby the voltage drop across the device 10 reflects the state of conduction caused by operation of gate control ($G_2$) but modified as to the threshold of conduction by operation of the charge on gate $G_1$.

It should be noted that the actual value of the charge state of gate $G_1$ is really of secondary importance. Decisive is how large a voltage drop can be produced across device 10 and what particular voltage level will terminal 15 assume once transistor 14 has been rendered conductive for readout of device 10. The two transistors 13 and 14 are controlled by a decoder 20 which receives address signals (words) and decodes them for access to the particular device 10. A read control gate 21 applies the decoded address signal to the gate of transistor 13, provided a read clock pulse signal is also applied to the gate 21. That read clock pulse is issued from and by a central control (not shown) cycling, for example, the system to which the illustrated circuit pertains, through alternating read and write cycles. Write clock signals are applied to a gate 22 which receives also the decoded device address signal from circuit 20. These gated write clock signals are not applied directly to the write control transistors 11 and 12, but through a circuit to be described next.

Reference numeral 23 is assumed to represent a source of analog signals: that is to say source 23 furnishes one analog signal which is constant or varies, if at all, quite slowly as compared with the clock pulse rate of the system. An algebraic gate 24 couples the source 23 to the inverting input of a differential amplifier 25. In addition, gate 24 receives the decoded address signals so that presently source 23 is coupled to the particular circuit as controlling the device 10. The source 23 will conceivably be coupled to other such devices (having different addresses) during different phases of system operation.

The non-inverting input of differential amplifier 25 is connected to terminal 15. Therefore, amplifier 25 compares the analog signal from source 23 with the signal level achieved at terminal 15, but only during each read clock period.

The output of amplifier 25 is used as logic signal and should be low when the signal at terminal 15 is, e.g., about equal to or higher than the signal in source 23. The output of amplifier 25 should be high as long as the source signal exceeds the signal level of terminal 15.

The amplifier 25 should be constructed to provide the low output also during those periods in which a read clock pulse is not effective on gate 21.

The output of amplifier 25 is used, for example, to set a flip-flop 26 receiving the read clock signal, e.g., from 21, which is applied to the clocking input of the flip-flop accordingly. The clock sets on the trailing edge of the read clock provided, of course, that a high output is applied by amplifier 25 to the set input of the flip-flop. The flip-flop 26 is reset or erased with each write clock signal from gate 22, on the trailing edge thereof.

The set-output of the flip-flop 26 is applied to a gate 27 which is open during the write clock, and the output pulse of that gate 27 is used to gate open the two transistors 11 and 12. It can readily be seen that such a control pulse is fed by gate 27 to transistors 11 and 12 only, if during the previous read cycle amplifier 25 detected that the voltage at terminal 15 is still too low.

The circuit as described, operates as follows: As the specific device 10 and its associated circuitry is addressed, circuit 20 decodes the address as applied and opens the two gates 21 and 22, so that read and write clock pulses can pass.

The latter pulses are, of course, furnished in alternating sequence irrespective of any addressing. Read and write cycles follow and alternate in sequence. Assuming that a read cycle occurs first after addressing, the two transistors 13, 14, are enabled and apply the voltage drop at junction 15 to the non-inverting input of amplifier 25. Concurrently, gate 24 applies the current analog signal from source 23 to the inverting input of amplifier 25.

It is assumed that device 10 holds little or no charge on its floating gate; in other words, it has not previously been programmed. Accordingly, a rather low voltage prevails on terminal 15 causing the amplifier 25 to furnish a high output which sets the flip-flop 26 at the trailing edge of the read clock. During the write cycle that follows, a clock pulse from 22 passes gate 27 and opens transistors 11 and 12 so that a charge pulse is applied to the floating gate $G_1$. The flip-flop 26 ignores any output charge on amplifier 25 because at the end of the write clock signal the flip-flop 26 is reset, and no clock input is effective.

The charge pulse for the floating gate $G_1$ changes (reduces) the effective impedance of device 10 so that the voltage on terminal 15 has increased. During the next read cycle the voltage on terminal 15 is again compared with the analog signal from source 23, and if that latter signal is still lower, flip-flop 26 will be set again on the trailing edge of the read clock. Thus, another charge pulse will be passed to gate $G_1$ during the following write cycle.

It can thus be seen that the charge on floating gate $G_1$ will be augmented as long as the signal level in terminal 15 is not lower than the source 23 voltage. Only after the signal level in terminal 15 increases above the voltage from source 23, flip-flop 26 will not be set during the read cycle that follows the write cycle, which produced that final charge pulse.

A gate 28 responds to the reset state of flip-flop 26 during the next write cycle causing, for example, the addressing circuit to switch to the next address or terminating the operation otherwise.

It can thus be seen that the circuit operates independently from the particulars of the device 10, as long as it stores a charge, which varies the actual conduction and voltage drop across the device in dependence upon that retained charge. The device structure and the necessary operating voltages may vary. Also, one may use avalanche diode breakdown rather than tunneling for charging floating gate $G_1$. In either case, the analog signal is in effect converted into a period of charging, i.e., the length of that period is made to relate to the analog signal. The relation may or may not be a proportionate one, which is of no importance as long as the resultant charge state causes, under specified drain bias (such as provided during the read cycle), the production of an output voltage which is, in fact, proportionate (or actually equal) to the analog signal. Thus, the analog signal has been stored, and will remain stored in dependence upon the charge retention capabilities of the device 10. For the same reasons, it is not important whether the relationship between the charge of the floating gate $G_1$ and the voltage drop at terminal 15 is a linear one, as long as the relationship is a monotonic one.

It can readily be seen that during the process of storing the circuit converts the magnitude of an analog signal into a charge duration period, given by the sum all the write periods needed to complete the charge to obtain equality of the inputs of amplifier 25, without requiring a predetermining or predetermined control of and in regard to the duration of that charging process. It is possible in principle to convert at first the analog signal into an uninterrupted charge duration period, it is clearly impractical to proceed in that manner because now one has to fully account for the conversion characteristics: analog signal-to-period of time-to-charge level-to voltage level at 15. Aside from the fact that this may require the synthesis of a rather complicated characteristics, such a characteristic may vary from device to device. The trial and error method is clearly preferred and, ultimately, does produce a true charge duration-analog signal conversion. It should be mentioned that the step wise charge augmentation could proceed in the subtractive mode. That is to say the gate electrode $G_1$ will initially obtain a high charge, and sequentially erase pulses as applied. The output of amplifier 25 will be connected to the reset output of flip-flop 26.

The invention is not limited to the embodiments described above but all changes and modifications thereof not constituting departures from the spirit and scope of the invention are intended to be included.

I claim:

1. A device for storing analog signals of variable magnitude as supplied by a source for analog signals, comprising:
    a semiconductor device having source and drain electrodes, a channel region covered by insulation, a first gate electrode completely embedded in the insulation above the channel region to establish a floating gate and a second gate electrode above the first gate electrode but isolated therefrom;
    a read circuit connected to the semiconductor device to provide an output signal in proportion to any charge on the floating gate;
    comparing means connected to the read circuit and to the source for analog signals to provide representations of similarity and dissimilarity between a signal furnished by the source for analog signals and the output signal;
    first circuit means conductively connected to the second gate electrode and to the channel region for applying a charge voltage to be effective between the channel region and the second gate to obtain a charge on the floating gate; and
    second circuit means connected to the first circuit means and to the comparing means for controlling the first circuit means for obtaining the charge on the floating gate at a level corresponding to the analog signal as provided by the source for analog signals.

2. A device as in claim 1, wherein the first circuit means applies pulses as charge or discharge voltages to the floating gate to sequentially augment the charge thereof; the second means controlling the number of pulses needed to obtain the charge at said level.

3. A device for storing analog signals of variable magnitude as supplied by a source for analog signals, comprising:
    a semiconductor device having source and drain electrodes, a channel region covered by insulation, a first gate electrode completely embedded in the insulation above the channel region to establish a floating gate and a second gate electrode above the first gate electrode but isolated therefrom;
    a write circuit connected to the second gate electrode and to the channel to apply a voltage therebetween for charging the first gate electrode;
    a read circuit connected to the channel to read conduction thereof as determined by the charge on the first gate electrode;
    comparing means connected to the source and to the read circuit to determine whether the read conduction corresponds to the analog signal as supplied by the source; and
    circuit means connected to the comparing means and to the write circuit, to augment the charge on the first gate electrode until the read conduction corresponds to the analog signal.

4. A device as in claim 3, including means for alternatingly operating the read and write circuits to obtain stepwise augmentation of the charge on the first gate.

5. A device for storing analog signals of variable magnitude as supplied by a source for analog signals, comprising:
    a semiconductor device having source and drain electrodes, a channel region covered by insulation, a first gate electrode completely embedded in the insulation above the channel region to establish a floating gate and a second gate electrode above the first gate electrode but isolated therefrom;
    an output circuit for the device providing a signal representing stored changes on the floating gate;
    circuit means connected to the source and to the second gate to apply to said second gate a sequence of pulses having a voltage time integral that represents the analog signal from the source; and
    circuit means connected to control the number of pulses of the sequence so that the output circuit provides an output that agrees with the analog signal from the source.

6. A device for storing analog signals of variable magnitude as supplied by a source for analog signals, comprising:
    a semiconductor device having source and drain electrodes, a channel region covered by insulation, a first gate electrode completely embedded in the insulation above the channel region to establish a floating gate and a second gate electrode above the first gate electrode but isolated therefrom;

first circuit means connected to the source-to-drain path of the semiconductor device, to the second gate and to the source, to apply to the first gate a charge representing the analog signal from the source; and second circuit means connected to the source-to-drain path of the semiconductor device and to the second gate to monitor the current flow through the source-to-drain path of the semiconductor device and providing a signal whose analog value represents the analog signal from the source and a representation of which is stored as a charge on the first gate.

* * * * *